(12) United States Patent
Ashjaee et al.

(10) Patent No.: US 8,016,007 B2
(45) Date of Patent: Sep. 13, 2011

(54) METHOD AND APPARATUS FOR STRINGING THIN FILM SOLAR CELLS

(75) Inventors: Jalal Ashjaee, Cupertino, CA (US); Douglas W Young, Mount Pleasant, UT (US); Kiet Tran, Fremont, CA (US); Steve Kuskie, Morgan Hill, CA (US)

(73) Assignee: SoloPower, Inc., San Jose, CA (US)

( * ) Notice: Subject to any disclaimer, the term of this patent is extended or adjusted under 35 U.S.C. 154(b) by 52 days.

(21) Appl. No.: 12/698,903

(22) Filed: Feb. 2, 2010

(65) Prior Publication Data

US 2010/0200170 A1 Aug. 12, 2010

Related U.S. Application Data

(60) Provisional application No. 61/149,269, filed on Feb. 2, 2009.

(51) Int. Cl.
*B32B 37/00* (2006.01)

(52) U.S. Cl. ......... 156/498; 156/350; 156/499; 156/538

(58) Field of Classification Search .................. 156/350, 156/498, 499, 538, 539, 556
See application file for complete search history.

(56) References Cited

U.S. PATENT DOCUMENTS

| | | | | |
|---|---|---|---|---|
| 6,777,610 | B2 * | 8/2004 | Yamada et al. | 136/251 |
| 6,870,087 | B1 * | 3/2005 | Gallagher | 136/246 |
| 7,902,301 | B2 * | 3/2011 | Kempe et al. | 525/342 |
| 2004/0084078 | A1 * | 5/2004 | Yoshida et al. | 136/251 |

* cited by examiner

*Primary Examiner* — James Sells
(74) *Attorney, Agent, or Firm* — Pillsbury Winthrop Shaw Pittman LLP

(57) ABSTRACT

The present inventions generally relate to thin film solar cell fabrication, and more particularly, to techniques for interconnecting solar cells based on Group IBIIIAVIA thin film semiconductors. In a particular embodiment, a system is described that positions solar cells and conductive leads with respect to each other so that application of a conductive adhesive and formation of an assembled solar cell string, followed by curing and cooling of the conductive adhesive, can occur in a repeatable manner.

13 Claims, 3 Drawing Sheets

METHOD AND APPARATUS FOR STRINGING THIN FILM SOLAR CELLS

RELATED APPLICATIONS

This application is related to and claims priority from U.S. Provisional Application No. 61/149,269 entitled "Method And Apparatus For Stringing Thin Film Solar Cells" filed on Feb. 2, 2009, which application is expressly incorporated by reference herein.

BACKGROUND

1. Field of the Inventions

The present inventions generally relate to thin film solar cell fabrication, more particularly, to techniques for interconnecting solar cells based on Group IBIIIAVIA thin film semiconductors.

2. Description of the Related Art

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(S_ySe_{1-y})_k$, where $0 \leq x \leq 1$, $0 \leq y \leq 1$ and k is approximately 2, have already been employed in solar cell structures that yielded conversion efficiencies approaching 20%. It should be noted that the notation "Cu(X,Y)" in the chemical formula means all chemical compositions of X and Y from (X=0% and Y=100%) to (X=100% and Y=0%). For example, Cu(In,Ga) means all compositions from CuIn to CuGa. Similarly, $Cu(In,Ga)(S,Se)_2$ means the whole family of compounds with Ga/(Ga+In) molar ratio varying from 0 to 1, and Se/(Se+S) molar ratio varying from 0 to 1.

The structure of a conventional Group IBIIIAVIA compound photovoltaic cell such as a $Cu(In,Ga,Al)(S,Se,Te)_2$ thin film solar cell is shown in FIG. 1. A photovoltaic cell 10 is fabricated on a substrate 11, such as a sheet of glass, a sheet of metal, an insulating foil or web, or a conductive foil or web. An absorber film 12, which comprises a material in the family of $Cu(In,Ga,Al)(S,Se,Te)_2$, is grown over a contact layer 13, which is previously deposited on the substrate 11 and which acts as the electrical contact to the absorber film 12 of the device. The substrate 11 and the contact layer 13 form a base 20 on which the absorber film 12 is formed. Various conductive layers comprising Mo, Ta, W, Ti, and their nitrides have been used in the solar cell structure of FIG. 1. If the substrate itself is a properly selected conductive material, it is possible not to use the contact layer 13, since the substrate 11 may then be used as the ohmic contact to the device. After the absorber film 12 is grown, a transparent layer 14 such as a CdS, ZnO, CdS/ZnO or CdS/ZnO/ITO stack is formed on the absorber film 12. Radiation 15 enters the device through the transparent layer 14. A metallic grid pattern or finger pattern (not shown) comprising busbars and fingers may also be deposited over the transparent layer 14 to reduce the effective series resistance of the device. The preferred electrical type of the absorber film 12 is p-type, and the preferred electrical type of the transparent layer 14 is n-type. However, an n-type absorber and a p-type window layer can also be utilized. The preferred device structure of FIG. 1 is called a "substrate-type" structure. A "superstrate-type" structure can also be constructed by depositing a transparent conductive layer on a transparent superstrate such as glass or transparent polymeric foil, and then depositing the $Cu(In,Ga,Al)(S,Se,Te)_2$ absorber film, and finally forming an ohmic contact to the device by a conductive layer. In this superstrate structure light enters the device from the transparent superstrate side.

If the substrate 11 of the CIGS(S) type cell shown in FIG. 1 is a metallic foil, a positive voltage develops on the substrate 11 with respect to the transparent layer 14 under illumination. In other words, an electrical wire (not shown) that may be attached to the substrate 11 would constitute the (+) terminal of the solar cell 10 and a lead (not shown) that may be connected to the transparent layer 14 (or to a bulbar of the metallic grid pattern that may be deposited on the transparent layer 14) would constitute the (−) terminal of the solar cell.

After fabrication, individual solar cells are typically assembled into solar cell strings and circuits by interconnecting them (usually in series) electrically, i.e. by connecting the (+) terminal of one cell to the (−) terminal of a neighboring cell. This way the total voltage of the solar cell circuit is increased. The solar cell circuit is then laminated into a protective package to form a photovoltaic module.

For a device structure of FIG. 1, if the substrate 11 is a conductive metallic foil, series interconnection of cells may be carried out by connecting the substrate 11 at the back or un-illuminated side of one particular cell to the busbar of the finger pattern (not shown) at the front or illuminated side of the adjacent cell. A common industry practice is to use conductive wires, preferably in the form of strips of flat conductors or ribbons to interconnect a plurality of solar cells to form first a circuit and then a module as described before. Such ribbons are typically made of copper, coated with tin and/or silver. For standard crystalline Si-based technology, ribbons are attached to the front and back sides of the cells in the module structure using a suitable soldering material since both the top grid pattern of the cell and the bottom contact of the cell comprise easily solderable metallic materials such as silver. High temperature solders with processing temperatures in excess of 200° C., typically in excess of 300° C., may be used in the interconnection of Si cells to form "strings" which may then be interconnected by a process called "bussing" to form the module circuit.

Unlike Si solar cells, the thin film Group IBIIIAVIA compound solar cell of FIG. 1 may be fabricated on a metallic foil substrate such as a flexible stainless steel web or aluminum alloy foil. These materials may not be easily soldered, especially since the process temperature for this type of solar cell is limited to less than about 250° C., preferably less than 200° C. Therefore, conductive adhesives are usually employed to attach the Cu ribbons to the busbar of the grid pattern and the back contact or the back surface of the substrate of such solar cells during their interconnection. Although such techniques are in use in products, the contact resistance of the electrical contacts attached by conductive adhesives to metal foil based thin film solar cells still needs to be reduced. Adhesion of the contact to the back surface of the metallic foil substrates also needs improvement. A number of solar cells are connected together typically in series via a number of electrically conductive wires or ribbons to form what is commonly called a cell "string." Each string has a voltage equal to the sum of the voltages of the individual cells in that string. There may be one or more conducting wires connecting each successive pair of cells depending on the electrical current collection pattern which in turn depends on the size and the shape of the cells. One common way to attach ribbons to cells is to use special conductive inks that when cured, i.e. when heated and maintained at appropriate curing temperature for sufficient time, form mechanically strong bonds that conduct electricity with low resistance.

The stringing step is a significant part of the total PV module fabrication. With respect to conventional stringing, there have been limited automated tools developed for stringing thin foil solar cells. These conventional tools are also inefficient, as they rely on complex handling systems for the cells and the strings since the strings are not rigid bodies. These systems also may rely on repeated detection and positioning of the cells or the strings at various process steps, again since the strings are not rigid and also because the bond between the ribbons and the cells are extremely weak before the conductive ink is cured. Additionally, transportation of the string in these systems before the ink is cured requires elaborate measures to prevent reliability problems that could be introduced as a result weak adhesion between the ribbons and the cells.

Therefore, there is a need to develop systems and methods that will achieve secure handling and transportation of the strings during string formation while fixing the relative positions of the cells in the string with respect to each other.

SUMMARY

The present inventions generally relate to thin film solar cell fabrication, and more particularly, to techniques for interconnecting solar cells based on Group IBIIIAVIA thin film semiconductors.

In a particular embodiment, a system is described that positions solar cells and conductive leads with respect to each other so that application of a conductive adhesive and formation of an assembled solar cell string, followed by curing and cooling of the conductive adhesive, can occur in a repeatable manner.

In a particular embodiment is described a system to interconnect a plurality of solar cells to form a solar cell string for solar cell modules, comprising: a support device including a plurality of support members arranged in a row and extending along a horizontal plane of the support device; an assembly station including an assembly platform to receive the support device and form an assembled solar cell string in the support device by placing the plurality of solar cells into the support device such that each solar cell is placed over one of the support members of the plurality of support members and each solar cell is electrically interconnected to any solar cell located adjacent thereto by conductive leads, the conductive leads being attached to the solar cells with a conductive adhesive; a curing station including a heating platform to receive the support device with the assembled solar cell string from the assembly station, wherein the heating platform heats the support members carrying the solar cells to cure the adhesive attaching the conductive leads to the solar cells of the assembled solar cell string; a cooling station including a cooling platform to receive the support device with the assembled solar cell string from the curing station, wherein the cooling platform cools the support members carrying the solar cells to solidify the adhesive attaching the conductive leads to the solar cells, thereby forming the solar cell string; and a carrier to transport the support device among the assembly station, the curing station and the cooling station.

BRIEF DESCRIPTION OF THE DRAWINGS

The above and other aspects and features will become apparent to those of ordinary skill in the art upon review of the following description of specific embodiments in conjunction with the accompanying figures, wherein.

DETAILED DESCRIPTION OF THE PREFERRED EMBODIMENTS

The embodiments described herein are for a method and apparatus for manufacturing solar cell strings, circuit or modules by interconnecting the solar cells with interconnects, conductive leads or ribbons. The embodiments will be described using a stringing process or interconnection process to form a solar cell string or array of preferably thin film CIGS solar cells formed on flexible metallic foil substrates. The stringing process may comprise an assembly step to assemble the solar cell string by utilizing solar cells, interconnects and an adhesive in an assembly support device; a curing or heating step to cure the adhesive while the assembled string is held in the assembly support device; and a cooling step to cool the manufactured string while the assembly string is held in the assembly support device. The assembly support device retains the solar cells and the interconnects in their predetermined positions during manufacturing of the string. The assembly support device may be moved to various process locations by a carrier.

The stringing tool comprises: an assembly station where components of a string are assembled, for example, interconnects are aligned and connected to the solar cells with a conductive adhesive to form a string in the assembly support device; a curing station where the conductive adhesive is cured so that the interconnects and the solar cells are mechanically and electrically connected while the string is held in the assembly support device; and a cooling station where the manufactured string is cooled down to room temperature while the string is still held in the assembly support device, before exiting the stringing tool for subsequent processing steps such as string testing and binning. The stringing system described herein further includes a carrier to handle and transport the assembly support device, which retains the solar cell string, among the process stations. In one embodiment, the assembly support device comprises a plurality of assembly support members to contain each solar cell of the string during manufacturing. Each assembly support member is configured to hold at least one solar cell in a predetermined position during the manufacture of the solar cell string. The assembly support device retaining the solar cell string is held by the carrier and transported among the process stations.

Figure 1:
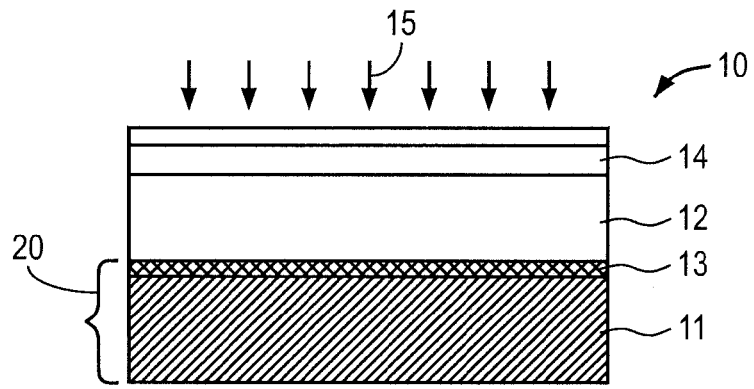
FIG. 1 is a side schematic view of a prior-art solar cell.
Figure 2:
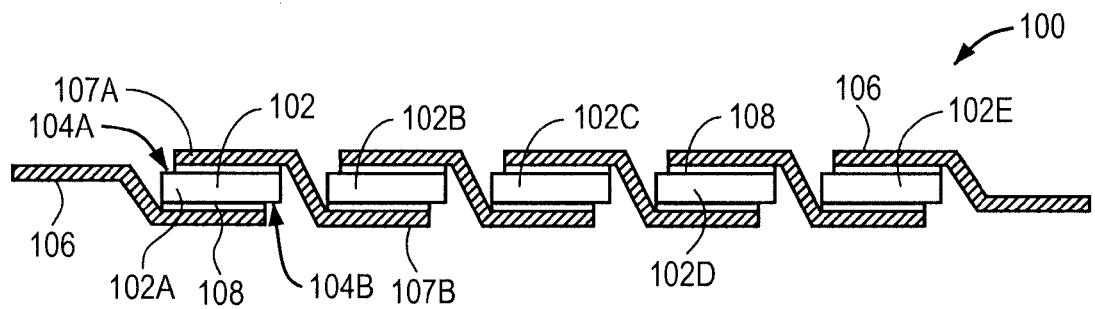
FIG. 2 is a schematic side view of a solar cell string formed by a process according to one of the preferred embodiments.
Figure 3A:
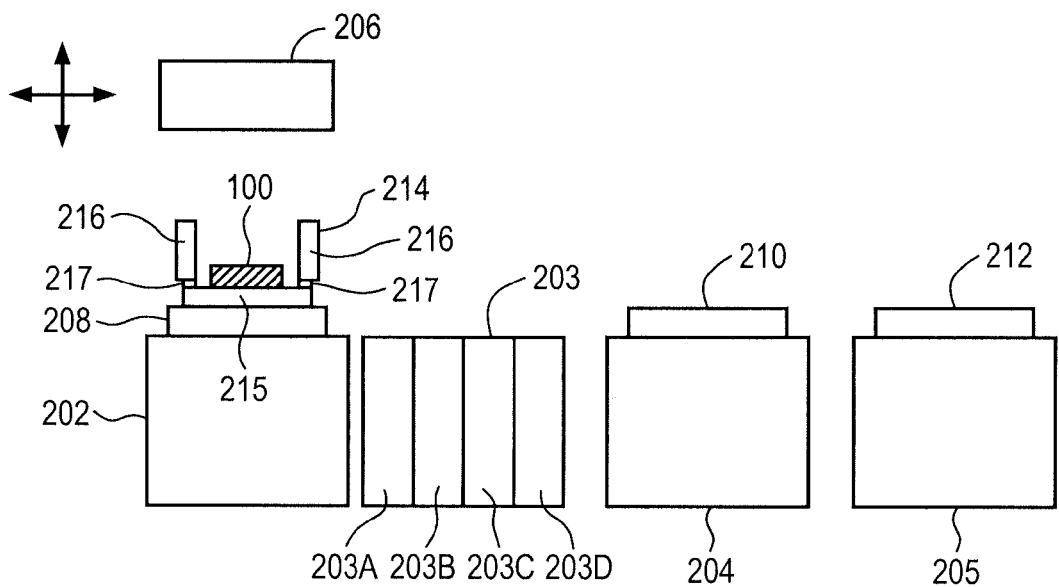
FIGS. 3A-3C are schematic side views of an embodiment of a stringing system including an assembly support device to perform a stringing process according to one of the preferred embodiments.
Figure 3B:
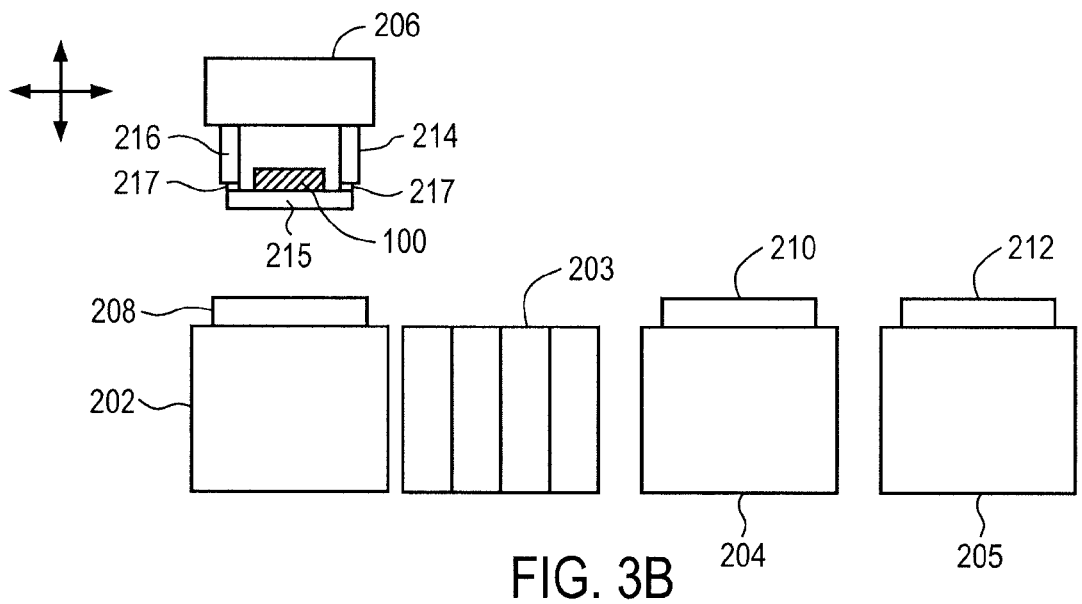
Figure 3C:
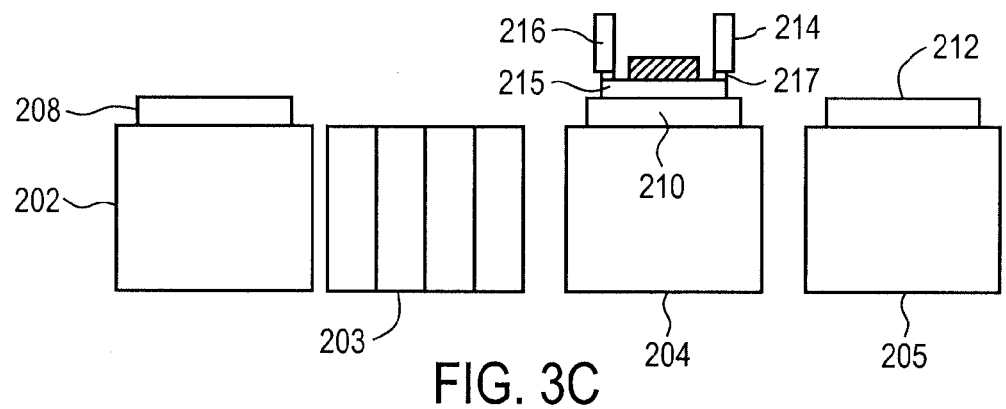

FIG. 2 shows, in side view, a solar cell string 100 manufactured using a stringing system 200 shown in FIGS. 3A-3C. The solar cell string 100 includes solar cells 102 with a front surface 104A and a back surface 104B. As described in the background section the front surface 104A is the light receiving side of the solar cells and the back surface is a surface of a metallic substrate of the solar cell. In the exemplary solar cell string 100, there are 5 interconnected solar cells, namely solar cells 102A, 102B, 102C, 102D and 102E. In solar cell string 100, each front surface 104A is connected to the back surface 104B of one of the solar cells 102 next to it by employing at least one or more interconnects 106 or conductive ribbons between them. As shown in FIG. 2, for example a first portion 107A of one of the interconnects 106 is attached to the front surface 104A of the solar cell 102A, and a second portion 107B of the same interconnect is attached to the back surface 104B of the solar cell 102B, the next solar cell. The interconnects 106 are attached to the front and back surfaces 104A and 104B using a conductive adhesive 108. Further, the front surface 104A may include busbars and a finger patterns (not show) attached to the busbars, and the interconnect 106 are typically attached to busbars on the front surface 104A with the adhesive 108. The interconnects 106 may be directly attached to the metallic material of the back surface 104B with the adhesive 108.

FIG. 3A shows an embodiment of a stringing system 200 of the present invention in side view. In this embodiment, the stringing system 200 comprises an assembly station 202 where the conductive leads 106 and solar cells 102 are aligned and connected with the conductive adhesive 108 to form the string 100 shown in FIG. 2, a curing station 204 where the conductive adhesive 108 is cured and a cooling station 205 where the manufactured string is cooled down to room temperature before exiting the stringing system 200. The assembly station 202 includes a stringing platform 208 or assembly platform including a series of platform vacuum holes (not shown) placed in predetermined positions and connected to a vacuum source. As will be described more fully below an assembly support device 214 is placed over predetermined positions over the stringing platform 208. The assembly support device 214 may comprise at least one assembly support member 215 including a series of support holes (shown in FIG. 5) connected to the vacuum supply through the platform vacuum holes (not shown) and side holders 216 attached to both sides of the assembly support member 215 through spacers 217 or insulators. Alternatively, there may be a single side holder to hold the assembly support members 215. Each assembly support member 215 may be configured to hold at least one solar cell to form a string. For example if a string including 5 cells is manufactured, there may be only 5 assembly support members 215. The assembly support device 214 may be formed of individual pieces of the assembly support members 215 or alternatively integrated as a single piece including 5 separate support sections separated by gaps.

The assembly support members 215 are made of thermally conductive materials, such as metals, preferably aluminum or aluminum alloys, to enable heating or cooling of the string during the process. Interconnects 106 and solar cells 102 are initially loaded to the assembly support device 214 to form the string 100 while the assembly support members 215 are held on the stringing platform 208 as in the manner that will be described below. The adhesive 108 (see FIG. 2) applied on the string 100 when the string 100 is in the assembly station 202 is not cured yet (in FIGS. 3A-3C, the string is shown positioned perpendicular to the plane of page). The curing of the adhesive 108 is performed on a hot plate 210 of the curing station 204 and cooled at a cooling plate 212 of the cooling station 205 while the string 100 is still over the assembly support device 214. During the curing process, heat is transferred from the hot plate to the interconnected cells through the assembly support members 215. Curing temperature and time depend on the adhesive and are normally recommended by the supplier. Typical curing temperature is in the range of 130 to 150 degrees C. The advantage of hot plate is that curing temperature is achieved in less than one minute, and another one or two minutes of keeping at the curing temperature may be sufficient for curing the adhesive. Cooling may be even faster. A string is typically assembled in approximately 3 minutes or more depending on the number of cells. Therefore heating is normally not the limiting step. If it were, a second hot plate could be added.

During at least a portion of the manufacturing process, the string 100 may be held and transported by a carrier 206. The carrier 206 holds the assembly support device 214 having the solar cell string and transports the assembly support device 214 to the curing station 204 and cooling station 205 and return the empty assembly support device to assembly station 202 or a queue station after the manufactured string is unloaded. The carrier 206 may move vertically and horizontally by a moving mechanism (not shown), that is preferably computer-controlled, such as a robotic arm. Alternatively, the assembly support device 214 may be transported manually by operators. It is also possible that a second assembly support device may be used to assemble another solar cells string while a first assembly support device still carry a previously assembled solar cell string to the curing or cooling stations. An auxiliary station 203 or supply station may be located between the assembly station 202 and the curing station 204. The auxiliary station 203 may comprise a solar cell supply station 203A including a solar cell loader (not shown), an adhesive supply station 203B including an adhesive applicator (not shown), an interconnect 203C or ribbon supply station including an interconnect loader (not shown), a weight supply station 203D including a weight loader/un-loader (not shown), solar cell and interconnect aligners (not shown), and their moving mechanisms (not shown) such as robotic arms or the like. A control system (not shown) connected to a computer controls the flow of predetermined process steps. A system gantry (not shown) may surround the stringing system 200.

As shown in FIG. 3B, after the string 100 is assembled at the assembly station 202 in the assembly step, the freshly assembled string 100 and the assembly support device 214 in which the string is held are removed from the stringing platform by the carrier 206. Use of assembly support device 214 eliminates the need for realigning the string with uncured adhesive before, after or during the transportation. As a last step in the assembly station, at least one weight may be placed on the string or at least one weight may be placed on each solar cell to keep the cells and interconnects properly connected throughout the stringing process. The weight is designed such that it has limited surface area in contact with the cell in order to minimize the amount of heat transferred to the weight. In addition, there are pockets in the weight for the ribbons plus the necessary room of about 50 to 500 microns in height for the adhesive. Weights are designed such that they are mechanically restricted to move sideways within the string assembly device. The weight can weigh 100 to 1000 grams. The assembly support members 215 are attached to the side holders 216 through the spacers 217 which are made of a thermally insulating material so as not to transfer heat to the holders 216 when the assembly support device 214 is placed on the hot plate 210.

As shown in FIG. 3C, the solar cell string 100 held by the assembly support device 214 is placed over the hot plate 210 at the curing station 204 to cure the adhesive 108 in the curing step. Preferably, the width of the assembly support members 215 may be made equal to the width of the hot plate to apply heat only to the assembly support members 215. The assembly support device 214 containing the assembled string may be placed on the hot plate 210 or they may be kept on the hot plate 210 while still attached to the carrier 206. At this stage, the heat from the hot plate is transformed through the assembly support members 215 to the string 100. In the following cooling step, the string 100 with the cured adhesive is cooled down on the cooling plate 22 and the string, and if added previously, the weights are unloaded from the assembly support device 214. After this step, the assembly support device 214 may be returned back to the assembly station 202 for another string assembly. The system 200 may have more than one assembly support device and carrier to process multiple solar cell strings.

Figure 4:
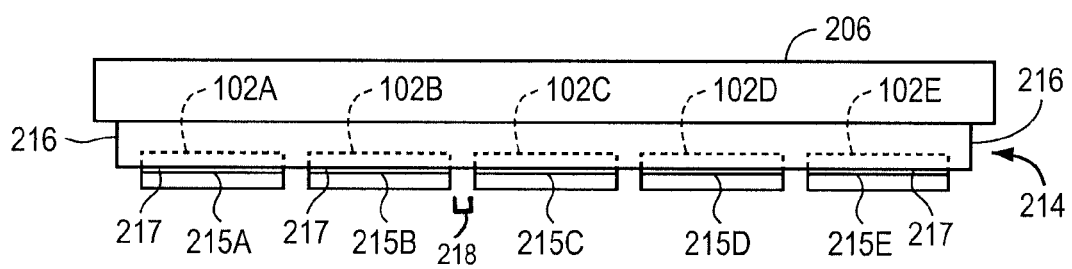
FIG. 4 is a schematic view of the assembly support device held by a carrier of the system shown in FIGS. 3A-3C.

FIG. 4 shows in side view the assembly support device 214 with the assembly support members 215, namely 215A, 215B, 215C, 215D, 215E, held by the carrier 206. The support members 215 are lined up along a horizontal axis of the support device 214 within a horizontal plane. Each assembly support member 215 carries one of the solar cells 102 and is removably attached to the carrier 206 by the side holders 216. The side holders 216 are also made of a metal, preferably aluminum. As mentioned above, the assembly support members 215 are attached to the side holders 216 through the spacers 217 which are made of thermally insulating materials such as ceramics or heat resistant rigid polymers. The spacers 217 forms a part of the side holders 216, and the support members 215 may be attached to spacers 217 by conventional means such as screwing, gluing or others. The thermally insulating material of the spacers 217 does not allow heat to transfer from the support members to side holders and to the carrier, and thereby they are protected from unwanted effects of heat. Alternatively, although metallic materials such as aluminum and its alloys, the side holders 216 may also be made of heat resistant materials and may be designed such that they may not contact the surface of the hot plate. In FIGS. 3A-4, weights or interconnects are not shown for clarity. Each assembly support member 215 is separated from the next assembly support member by a predetermined gap 218. The gap 218 compensates the expansion of the assembly support members 215 when they are heated during the curing process.

Figure 5:
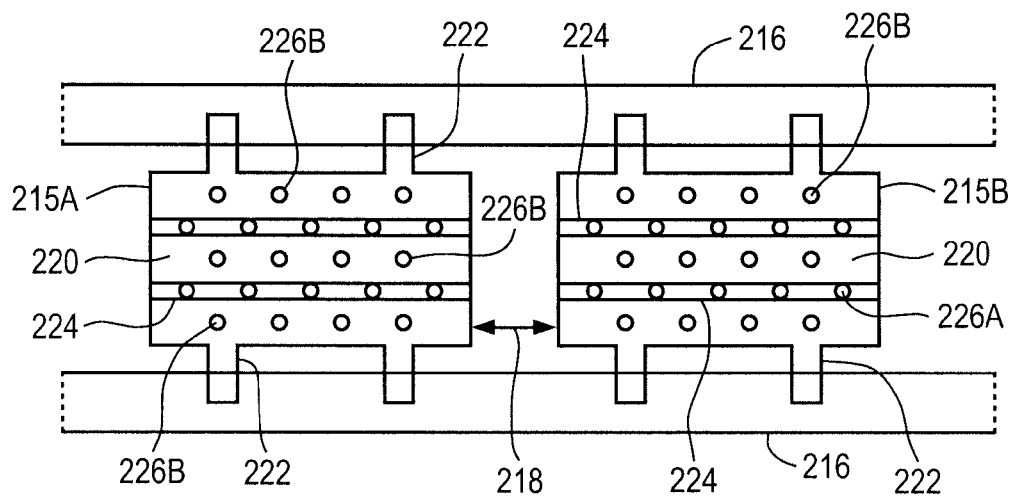
FIG. 5 is schematic plan view of a portion of the assembly support device.

As shown in FIG. 5, each assembly support member 215, for example 215A and 215B, includes a body 220 which may be a rectangular plate having side extensions 222 attached to the side holders 216 through the spacers 217 or insulators (see FIG. 4). The assembly support members may be made of aluminum and may have a thickness 0.5-3 millimeters (mm), preferably 1-1.5 mm. The length of the assembly support members may be at least equal to the length of the solar cells. As previously mentioned the width of the assembly support members 215 may be equal to the width of the hot plate 210 (FIGS. 3A-3C) so that the heating of them can be done efficiently. The body 220 of the assembly support member 215 may include interconnect grooves 224 to retain the second portion 107B of the interconnects 106 during the assembly of the string 100 (see FIG. 2). Each groove 224 include groove vacuum holes 226A to keep the interconnects 106 within the grooves by vacuum suction. The body 222 of each assembly support member 215 may also include support vacuum holes 226B to keep the solar cell 102 in a predetermined position when the vacuum is applied. The support vacuum holes 226B are distributed in accordance with the area that the solar cell occupies on the body 220 to effectively hold the solar cell 102 during the stringing process. It is also possible to include a recess (not shown) in the body 222 of the assembly support members 215 to better retain the solar cells of the string one on the assembly support members during the assembly process. Alternatively, dividers (not shown), such as protrusions extending from the side holders 217 towards the interconnect grooves 224 (but not intercepting them) to restrict the movement of the solar cells on the assembly support members. During the assembly process, when needed, the vacuum holes 226A and 226B are connected to a vacuum supply through the assembly platform 208 shown in FIGS. 3A-3C, and controlled by the controller (not shown).

Figure 6A:
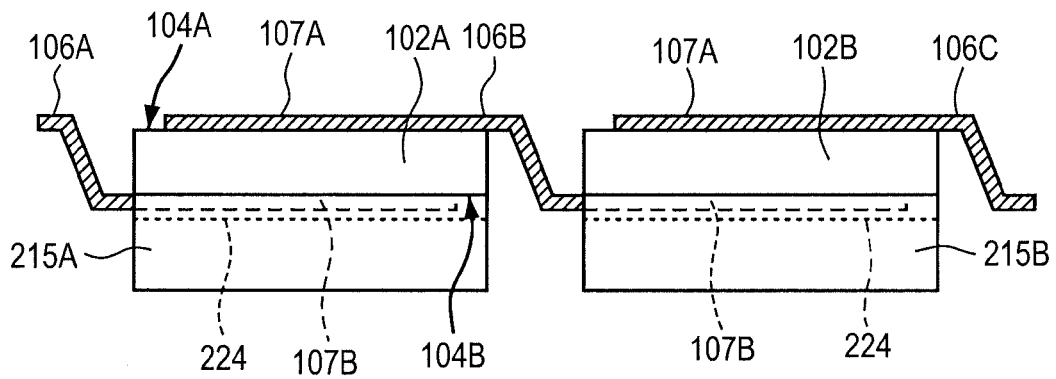
FIGS. 6A-6B are schematic views describing the assembly process according to one of the preferred embodiments.
Figure 6B:
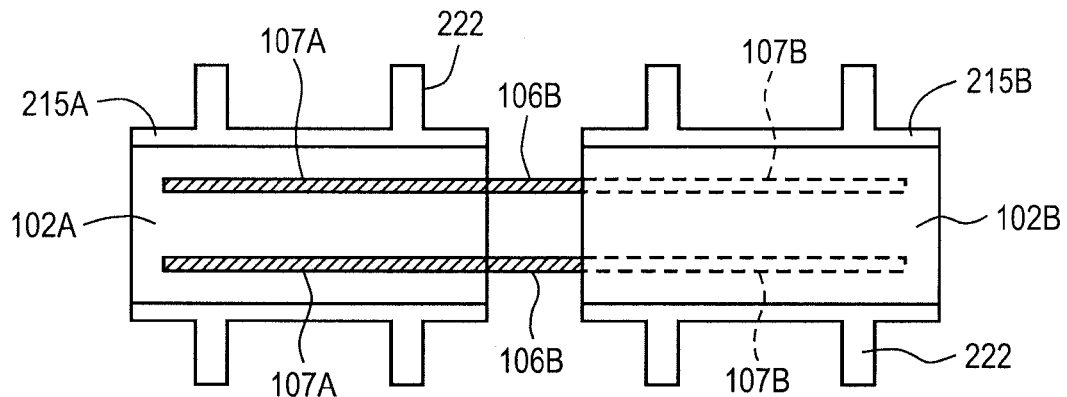

FIGS. 6A and 6B exemplify an assembly process performed at the assembly station 202 (FIG. 3A) using two solar cells. FIGS. 6A and 6B show the solar cell 102A is loaded on the assembly support members 215A and the solar cell 102B is loaded on the assembly support members 215B in side view and plan view respectively. Referring to FIG. 6A, in one preferred process sequence, initially a second portion 107B of a first interconnect set 106A is placed in the grooves 224 of the assembly support plate 215A by a interconnect loader (not shown), and vacuum is applied to the groove holes 226A to hold the interconnects in the grooves (see FIG. 5). Next, an adhesive applicator (not shown) applies the adhesive 108 (see FIG. 2) onto the second portions 107B of the first interconnect set 106A, and the back surface 104B of the solar cell 102A is placed on the second portions 107B of the first interconnect set 106A, and vacuum through the support holes 226B (see FIG. 5) is applied to hold the solar cell 102 in place. The solar cell 102A is transported from the solar cell supply station 203A (shown in FIGS. 3A-3C) by a solar cell loader (not shown). Referring to FIGS. 6A and 6B, in the next process step, first the adhesive is applied along the predetermined position of the interconnects on the front surface 104A, and a first portion 107A of a second interconnect set 106B is placed on the adhesive applied regions of the front surface 104A while a second portion 107B of the second interconnect set 106B is placed into the grooves 224 in the assembly support member 215B and held by vacuum. In the following step a weight (not shown) may be placed on the first portion 107A of the second interconnect set 106B. The same process steps are repeated to interconnect the solar cell 102B to 102A.

The stringing system 200 described above may be constructed in alternative tool configurations. For example, in an alternative stringing system embodiment, a process station (not shown) may include the curing 204 and cooling stations 205, and other stations to handle the manufactured string so that the string assembled in the assembly station 202 is taken into the process station for curing and cooling processes.

Although the present inventions are described with respect to certain preferred embodiments, modifications thereto will be apparent to those skilled in the art.

We claim:

1. A system to interconnect a plurality of solar cells to form a solar cell string for solar cell modules, comprising:
   a support device including a plurality of support members arranged in a row and extending along a horizontal plane of the support device;
   an assembly station including an assembly platform to receive the support device and form an assembled solar cell string in the support device by placing the plurality of solar cells into the support device such that each solar cell is placed over one of the support members of the plurality of support members and each solar cell is electrically interconnected to any solar cell located adjacent thereto by conductive leads, the conductive leads being attached to the solar cells with a conductive adhesive;

a curing station including a heating platform to receive the support device with the assembled solar cell string from the assembly station, wherein the heating platform heats the support members carrying the solar cells to cure the adhesive attaching the conductive leads to the solar cells of the assembled solar cell string;

a cooling station including a cooling platform to receive the support device with the assembled solar cell string from the curing station, wherein the cooling platform cools the support members carrying the solar cells to solidify the adhesive attaching the conductive leads to the solar cells, thereby forming the solar cell string; and a carrier to transport the support device among the assembly station, the curing station and the cooling station.

2. The system of claim 1, wherein each support member comprises a top surface and a bottom surface and the top surface includes at least one groove extending along the horizontal plane of the support device, the at least one groove holding first ends of the conductive leads during the assembly.

3. The system of claim 2, wherein each support member further comprises a recess to retain back sides of the solar cells in position while in the assembly station, wherein the first ends of the conductive leads are attached to back sides of the solar cells and second ends of the conductive leads are attached to light receiving surfaces of the solar cells using the adhesive within the assembly station.

4. The system of claim 3, wherein the support members include a plurality of support member openings to provide vacuum suction to the back sides of the solar cells and retain the solar cells on the support members within the assembly station, wherein the support member openings in the support members include a predetermined pattern.

5. The system of claim 4, wherein the assembly platform includes assembly platform openings having the same pattern as the openings of the support members so that when aligned the support member openings are connected to a vacuum system.

6. The system of claim 1, wherein the support device includes at least one side wall, and wherein at least a section of the at least one side wall of the support device includes a heat resistive material, and the support members are attached to the heat resistive material of the at least one side wall.

7. The system of claim 1 wherein the carrier includes a mechanism to attach and remove the support device from the carrier, the mechanism including a robotic arm.

8. The system of claim 7 wherein positioning of the carrier is computer controlled.

9. The system of claim 1 further comprising a supply station adjacent the assembly station, wherein the supply station includes a solar cell supply unit, a conductive lead supply unit, an adhesive supply unit and a weight supply unit to place weights onto the solar cells of the assembled solar cell string.

10. The system of claim 1, wherein the solar cell supply unit includes a solar cell loader, the conductive lead supply unit includes a conductive lead loader and aligner, the adhesive supply unit includes an adhesive applicator and the weight supply unit includes a weight loader-unloader.

11. The system of claim 1, wherein the support members are made of a material comprising aluminum.

12. The system of claim 1, wherein the width of the support members is substantially equal to the width of the heating platform to efficiently heat the support members.

13. The system of claim 12, wherein the thickness of the support members is in the range of 0.5-3 mm.

\* \* \* \* \*